United States Patent [19]
Kao et al.

[11] Patent Number: 5,647,116
[45] Date of Patent: Jul. 15, 1997

[54] METHOD FOR STRIPPING NON-SUPERCONDUCTIVE AG-BASED SHEATH FORMED ON A WIRE

[75] Inventors: Chin-Hai Kao, Hsinchu Hsien; Horng-Yi Tang, Feng Yuan, both of Taiwan

[73] Assignee: National Science Council, Taipei, Taiwan

[21] Appl. No.: 524,899

[22] Filed: Sep. 7, 1995

[51] Int. Cl.⁶ .................................................. H01L 39/24
[52] U.S. Cl. .............................. 29/599; 505/430; 505/884; 505/887
[58] Field of Search ................................ 29/599; 505/430, 505/431, 884, 887

[56] References Cited

U.S. PATENT DOCUMENTS

| | | | |
|---|---|---|---|
| 3,115,612 | 12/1963 | Meissner | 505/887 X |
| 4,586,012 | 4/1986 | Koizumi et al. | 505/887 X |
| 4,901,429 | 2/1990 | Srivastava . | |

FOREIGN PATENT DOCUMENTS 328903  8/1989  European Pat. Off. .

OTHER PUBLICATIONS

Journal of Materials Science Letters 12 (1993), pp. 706–709, entitled "Preparation and Characterization of Interface Morphologies of Silver–Sheathed Superconducting Bi–Sr–Ca–Cu–oxide Ribbons" by Wang et al.

IEEE Transactions on Applied Superconductivity, vol. 3, No. 1, Mar. 1993, pp. 946–948 entitled "Superconducting Joints Formed Between Powder–in–Tube $Bi_2Sr_2Ca_2Cu_3O_x$/AG Tapes" by Tkaczyk et al.

*Primary Examiner*—Carl J. Arbes
*Attorney, Agent, or Firm*—Curtis, Morris & Safford P.C.

[57] ABSTRACT

A non-superconductive Ag-based sheath formed surrounding a superconducting tape or wire is stripped by placing a Bi- or Pb-based metal material on the Ag-based sheath to be removed; and then heating the Bi- or pb-based metal material to 250° C.–450° C. to dissolve the Ag-based sheath; and removing the dissolved Ag-based sheath.

12 Claims, 1 Drawing Sheet

METHOD FOR STRIPPING NON-SUPERCONDUCTIVE AG-BASED SHEATH FORMED ON A WIRE

BACKGROUND OF THE INVENTION

1. Field of the Invention

The present invention relates to a method for stripping non-superconductive Ag-based sheath formed surrounding a superconducting tape or wire. In particular, it relates to a stripping method including placing Bi- or Pb-based metal materials on the Ag-based sheath, heating the Bi- or pb-based metal material to 250° C.–450° C. to dissolve the Ag-based sheath, and removing the dissolved Ag-based sheath.

2. Description of the Prior Art

High temperature superconductors are ceramic oxides that are directly drawn into wires or compressed into tapes with difficulty, because they lack the ductileness that metals have, and the tacky coefficient which quartzes have at a temperature higher than 1000° C. Accordingly, in the fabrication of high temperature superconducting tapes or wires, superconducting ceramic oxides are first filled in a tube, drawn into wires or compressed into tapes, and then subjected to sintering (the so-called powder-in-tube technique). The tube for this purpose is usually a silver or a silver alloy, for example a Ag—Cu alloy. In the applications of superconducting tapes or wires, very often it is necessary to joint two or more superconducting tapes or wires together. Conventional jointing methods include solid-state diffusion, brazing, soldering and welding. The jointing designs used include butt joints and lap joints. In view of the mechanical and electrical properties of the jointed superconducting tapes and wires, lap joints are generally utilized. However, both methods require stripping the outer Ag or Ag alloy tube (sheath).

Mechanical cutting is a method for stripping the sheath. However, this method often results in cracking of the inside ceramic superconducting materials, and thus causes a worsening of the properties of the superconducting materials (J. E. Thaczyk, R. H. Arendt, P. J. Garbauskas, B. A. Jones, R. J. Kilmer and K. W. Lay, "Superconducting joints formed between powder-in-tube $Bi_2Sr_2Ca_2Cu_3O_y$/Ag tapes", IEEE Transactions on Applied Superconductivity, 3 (1993) 946). Other methods, for example dissolving with mercury and the utilization of electrolytic polishing, are also been used to strip the sheath (Y. K. Tao, Y. Q. Wang, Y. Y. Sue, P. H. Hor and C. W. Chu, "Preparation and characterization of interface morphologies of silver-sheathed superconducting Bi—Sr—Ca—Cu—Oxide ribbons", J. Material Science Letters, 12(1993) 706 and George F. Vandaer Voort: Metallograph Principles and Practice, McGraw-Hill Book Company, Central Book Company, Taipei, Taiwan, 1984, Chap 2, p119–126 and Appendix H, P 591). However, these two methods are also unsatisfactory because mercury volatilizes easily and its vapor are toxic, and electrolytic polishing usually uses toxic cyanides as electrolytic polishing liquid. Another disadvantage of mechanical cutting and electrolytic polishing is that they are only suitable for stripping single-core superconducting tapes or wires.

SUMMARY OF THE INVENTION

It is therefore an object of the invention to provide a method for stripping non-superconductive Ag-based sheath formed surrounding a superconducting tape or wire, which can eliminate the disadvantages of the conventional methods.

This object is attained by placing a Bi- or Pb-based metal material on the Ag-based sheath to be removed, heating the Bi- or Pb-based metal material to 250° C.–450° C. to dissolve the Ag-based sheath, and then removing the dissolved Ag-based sheath.

The term "Ag-based sheath" refers to an Ag sheath and an Ag alloy sheath. The term "Bi-based metal material" refers to a Bi metal or a Bi alloy, and the term "Pb-based metal material" refers to a Pb metal or a Pb alloy.

According to an aspect of the invention, the method of the invention can be used to strip the sheath of a multi-core superconducting tape or wire.

According to another aspect of the invention, the heating is conducted at a relatively low temperature, and thus the properties of the superconducting materials are not affected.

According to a further aspect of the invention, the heating step can be conducted by using a torch, and thus the Ag-sheath can be removed in an expedited manner.

BRIEF DESCRIPTION OF THE DRAWINGS

The foregoing features of this invention, as well as the invention itself, may be fully understood from the following detailed description, examples and drawings in which.

DETAILED DESCRIPTION OF THE INVENTION

The method of the invention is suitable for stripping Ag-based sheath formed surrounding a superconducting tape or wire. The Ag-based sheath usually is made of Ag alloy. A typical alloy used for the Ag-based sheath is Ag—Cu alloy. According to the invention, preferably the Ag—Cu alloy contains less than 40 wt % of copper. If the content of the copper exceeds 40 wt %, the strength of the Ag—Cu alloy is too high for the fabrication of high temperature superconducting tapes or wires.

The Bi-based metal material suitable for placing on the Ag-based sheath contains at least 55 wt % of bismuth. The Pb-based metal material suitable for placing on the Ag-based sheath contains at least 50 wt % of lead. The Bi-based metal material and the Pb-based metal material can also contain other ingredients, for example indium and sodium. However, preferably the content of the indium should not exceed 15 wt % and the content of sodium should not exceed 10 wt %.

The Bi- or Pb-based metal materials are then heated to 250° C.–450° C. to dissolve the Ag-based sheath. This step can be conducted by using a torch, an induction heating method, an infrared ray or a laser heating method. The most convenient method is heating with a torch, because the gas blown out from the torch during the torching process can concurrently blow away the dissolved Ag-based sheath. The dissolved Ag-based sheath can also be removed by vacuum evacuation.

The following example is intended to demonstrate the invention more fully without acting as a limitation upon its scope, since numerous modifications and variations will be apparent to those skilled in this art.

EXAMPLE (1) Preparation of BPSCCO powders:

Nitrate salts of Bi, Pb, Sr, Ca and Cu were dissolved separately in ethylene glycol with a [Bi]:[Pb]:[Sr]:[Ca]:[Cu] ratio of 1.7:0.4:1.6:2.4:3.6 ([Bi$^{3+}$]=0.064M). The metal nitrate solutions were then mixed and added to the triethylammonium-oxalate and oxalic acid solution dropwise under constant stirring.

A pale blue precipitate formed and was filtered off, washed with ethanol, and finally dried at 120° C. overnight. The dried powder was calcined in air at 800° C. for 10 hours, producing a black powder. Further sintering of the compressed pellets of this black power was performed in air between 830° C. and 860° C. for 24 hours to obtain Bi—pb—Sr—Ca—Cu oxide powders (abbreviated as BPSCCO powder).

(2) Preparation of a BPSCCO tape

Figure 1:
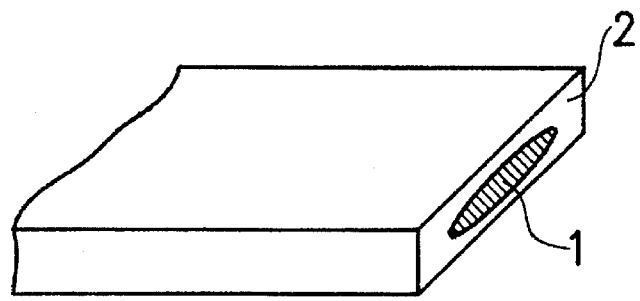
FIG. 1 is a schematic view of the formed BPSCCO tape of the Example.

The BPSCCO powder was filled in a silver tube having an inner diameter of 4 mm and an outer diameter of 6 mm. The Ag-sheathed superconductor was then subjected to drawing to a wire of 1 mm diameter, rolling and heat treated to produce a composite tube having a thickness of 0.2 mm and a width of 3.5 mm. A schematic view of the formed BPSCCO tape is shown in FIG. 1 in which 1 is the BPSCCO superconductor and 2 is the silver sheath.

(3) Stripping the silver sheath to be removed

Figure 2:
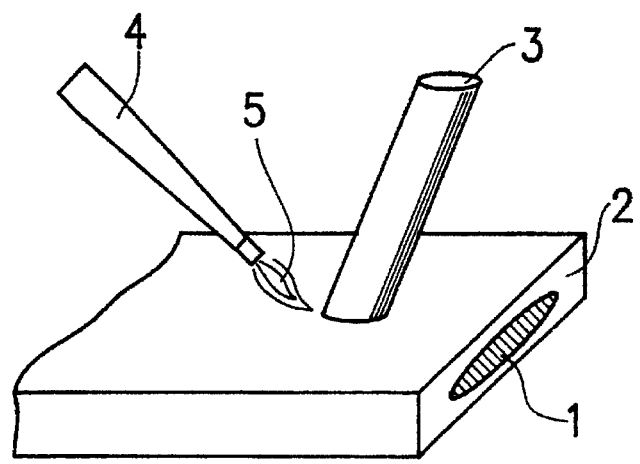
FIG. 2 is a schematic view depicting the Bi-or Pb-based metal material being heated by using a torch according to an preferred embodiment of the method of the invention.
Figure 3:
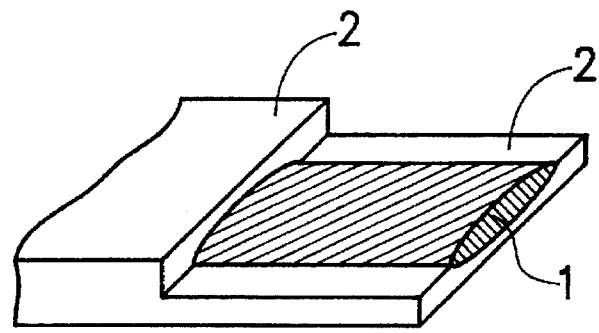
FIG. 3 is a perspective view of the BPCCO tape showing that a portion of Ag sheath has been removed.

FIG. 2 shows the method of stripping Ag sheath 2 by using a torch 4 according to the invention. A metal bismuth strip 3 was placed directly on the Ag sheath 2 to be removed, and a torch 4 was used to heat the metal bismuth strip 3 by directing the flame 5 on the surface of the Ag sheath 2 where the Bi strip 3 was placed. When the Bi strip 3 was to about 300° C., the metal Bi strip 3 melted, and concurrently the Ag sheath 2 was dissolved by the melted Bi. During the heating process, the melted Bi strip and the dissolved Ag sheath were blown away along the direction of the blowing gas of the torch 4 concurrently. It was observed that the BPSCCO superconductor was not affected by the heating. A perspective view of the BPCCO tape in which a portion of Ag sheath has been removed is shown in FIG. 3.

What is claimed is:

1. A method of stripping non-superconductive Ag-based sheath formed surrounding a superconducting tape, comprising the following steps:

(a) placing a Bi- or Pb-based metal material on the Ag-based sheath to be removed;

(b) heating the Bi- or pb-based metal material to 250°–450° C. to dissolve the Ag-based sheath; and (c) removing the dissolved Ag-based sheath.

2. The method as claimed in claim 1, wherein said Ag-based sheath contains less than 40 wt % of copper.

3. The method as claimed in claim 1, wherein said Bi-based metal material contains at least 55 wt % of Bi.

4. The method as claimed in claim 3, wherein said Bi-based material contains less than 15 wt % of indium and less than 10 wt % of sodium.

5. The method as claimed in claim 1, wherein said Pb-based metal material contains at least 50 wt % of Pb.

6. The method as claimed in claim 5, wherein said pb-based material contains less than 15 wt % of indium and less than 10 wt % of sodium.

7. The method as claimed in claim 1, wherein said heating is conducted by using a torch.

8. The method as claimed in claim 1, wherein said heating is conducted by using an induction heating method.

9. The method as claimed in claim 1, wherein said heating is conducted by using an infrared ray.

10. The method as claimed in claim 1, wherein said heating is conducted by using a laser.

11. The method as claimed in claim 1, wherein said dissolved Ag-based sheath is removed by a jet stream of gas.

12. The method as claimed in claim 1, wherein said dissolved Ag-based sheath is removed by vacuum evacuation.

* * * * *